US005750002A

United States Patent [19]

Hall, Jr. et al.

[11] Patent Number: 5,750,002
[45] Date of Patent: May 12, 1998

[54] METHOD FOR FABRICATING PIEZOELECTRIC POLYMER ACOUSTIC SENSORS

[75] Inventors: Thomas E. Hall, Jr., Newport News; Timothy D. Bryant, Gloucester, both of Va.

[73] Assignee: The United States of America as represented by the Administrator of the National Aeronautics and Space Administration, Washington, D.C.

[21] Appl. No.: 622,175

[22] Filed: Feb. 28, 1996

Related U.S. Application Data

[62] Division of Ser. No. 319,142, Oct. 4, 1994, abandoned.
[51] Int. Cl.[6] .............. H01B 13/00; B29C 63/02; B29C 65/54; B32B 3/08
[52] U.S. Cl. .............. 156/313; 156/228; 156/285; 156/306.6; 156/292
[58] Field of Search .............. 156/245, 285, 156/290, 292, 293, 295, 382, 581, 500, 313, 306.6, 306.9, 228; 425/388

[56] References Cited

U.S. PATENT DOCUMENTS

| 3,205,299 | 9/1965 | Dickie | 174/84 R |
| 3,681,171 | 8/1972 | Hojo et al. | 156/382 |
| 3,996,092 | 12/1976 | Sarazin et al. | 156/313 |
| 4,489,487 | 12/1984 | Bura | 156/230 |
| 5,068,714 | 11/1991 | Siepler | 257/703 |

FOREIGN PATENT DOCUMENTS 2-278615  11/1990  Japan.

*Primary Examiner*—Francis J. Lorin
*Attorney, Agent, or Firm*—Kimberly A. Chasteen

[57] ABSTRACT

A method for forming a sensor includes providing a first and a second film and bonding an internal connection tab therebetween. The internal connection tab is positioned between the inner surfaces of the first and second films. Then a conductive adhesive is applied to either the tab or to the inner film surfaces such that the inner surfaces of the films and the tab are electrically connected. Finally, the films are pressed together to bond the films together with the internal connection tab inbetween.

4 Claims, 9 Drawing Sheets

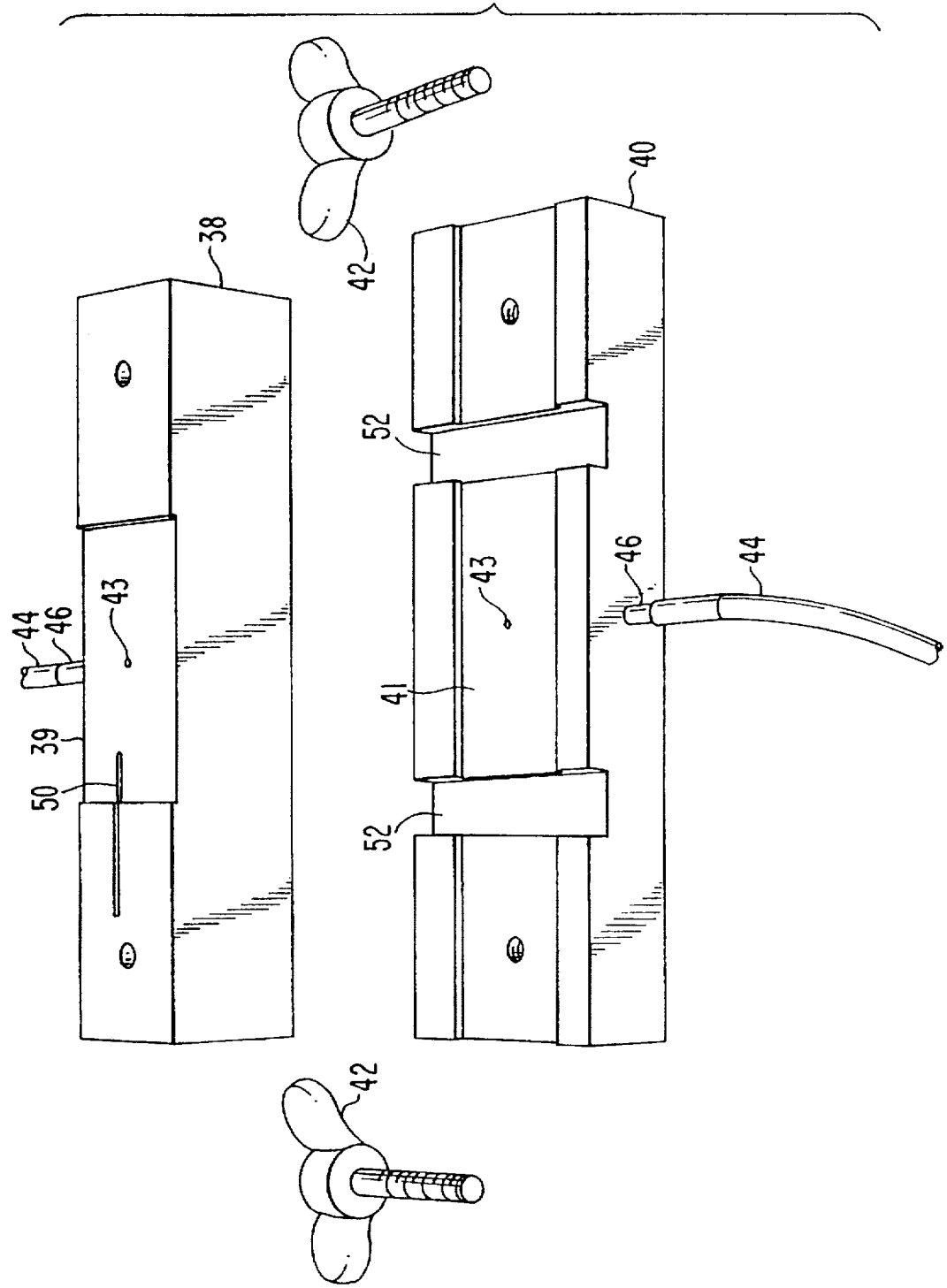

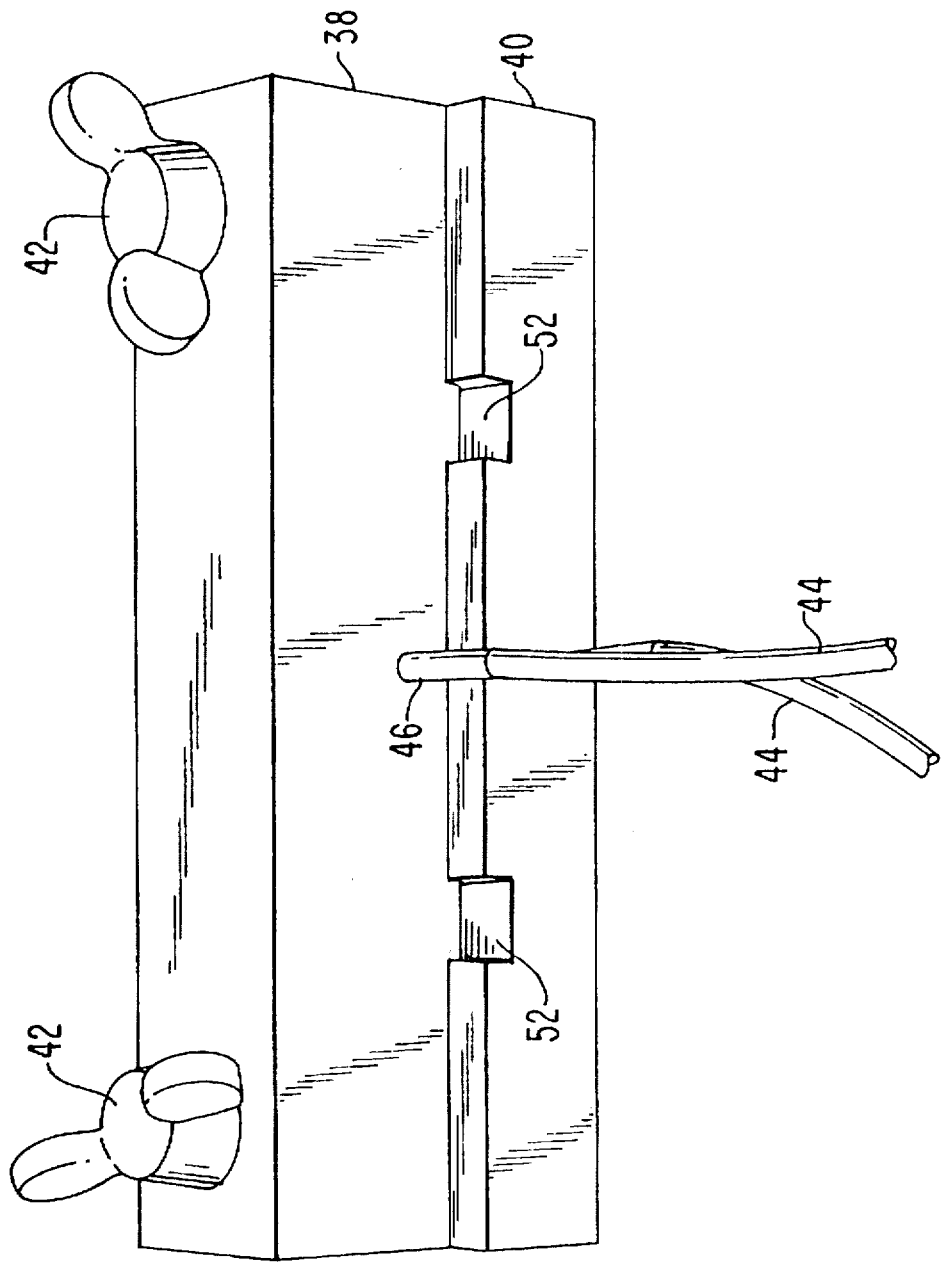

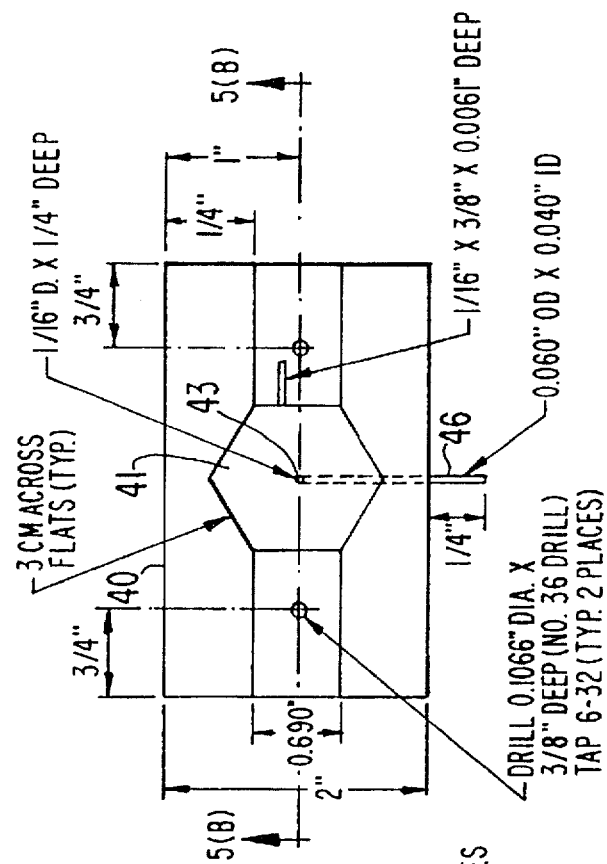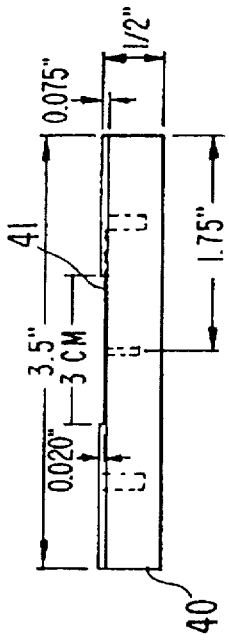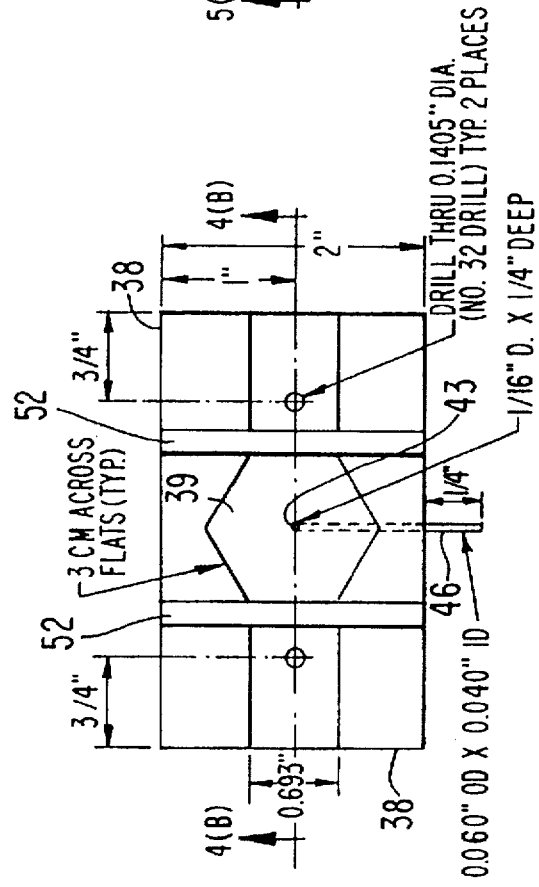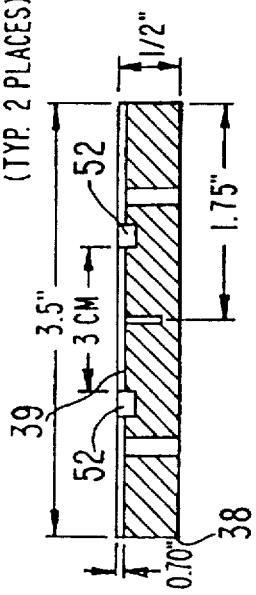

METHOD FOR FABRICATING PIEZOELECTRIC POLYMER ACOUSTIC SENSORS

This is a divisional of application Ser. No. 08/319,142 filed on Oct. 4, 1994, now abandoned

ORIGIN OF THE INVENTION

The invention described herein was made by employees of the United States Government and may be manufactured and used by or for the Government for governmental purposes without the payment of any royalties thereon or therefor.

BACKGROUND OF THE INVENTION

1. Field of the Invention

The present invention relates to a vacuum holding fixture and method for fabricating piezoelectric polymer acoustic sensors.

2. Description of the Related Art

A fetal monitoring system which monitors the status of a fetus inside an expectant mother is disclosed in U.S. Pat. No. 5,140,992. The fetal monitoring system receives pressure pulses emitted from a fetus inside the mother and filters out pressure pulses originating from sources other than the fetus, such as pulses originating from the maternal heart. The fetal monitoring system uses a belt which mounts several piezoelectric polymer acoustic sensors. The belt is worn by an expectant mother to press the sensors against the mother's body to allow the sensors to detect the status of the fetus.

FIG. 1 illustrates a sensor as used by the fetal monitoring system disclosed in U.S. Pat. No. 5,140,992. The sensor is formed by two pieces of film (hereinafter a "first film 20" and a "second film 22") which are bonded together by an adhesive 23. First film 20 and second film 22 are each a strip of 0.004" thick polyvinylidene fluoride (PVF$_2$) piezoelectric film. First film 20 and second film 22 each have an inner surface with a metal coating 24, 26 and an outer surface with a metal coating 28, 30. Each surface of first film 20 and second film 22 has a respective positive or negative dipole moment so that each film has a positive dipole moment on one surface and a negative dipole moment on the other surface. Such films are well-known in the art and are fully described in U.S. Pat. No. 5,140,992. An internal connection port 32 is formed between first film 20 and second film 22 and is used to connect the sensor to the center conductor wire 34 of a coaxial cable 35. Center conductor wire 34 is inserted into internal connection port 32 and is electrically connected to the inner surface metal coatings 24, 26 of the bonded first film 20 and second film 22. The outer conductor 36 of coaxial cable 35 is electrically connected to the metal coatings 28, 30 on the outer surfaces of first film 20 and second film 22.

Thus, a sensor is formed by bonding together two pieces of piezoelectric polymer film, such as polyvinylidene fluoride (PVF$_2$). Conventional methods of bonding together two pieces of piezoelectric polymer film include simply taping or pressing the two pieces of film together with an adhesive. However, such methods do not maintain uniform thickness of the adhesive between the films and do not maintain uniform "flatness" of the film. Therefore, the resulting sensor does not have a uniform thickness. Also, such conventional methods of bonding do not maintain a uniform adhesive bond line between the films.

SUMMARY OF THE INVENTION

Accordingly, it is an object of the present invention to provide an apparatus and method for bonding two pieces of film so that a uniform thickness of the adhesive is obtained, the film is held flatly in place, and a uniform adhesive bond line is obtained to produce a sensor of uniform thickness.

It is a further object of the present invention to provide a method and apparatus of bonding two pieces of film so that an internal connection port is formed between the films to allow the center conductor of a coaxial cable conductor to be connected to the inner surfaces of the films.

It is an additional object of the present invention to provide an improved sensor formed by two pieces of film and having an internal connection tab bonded between the two pieces of film, instead of having an internal connection port.

It is a further object of the present invention to provide a method and apparatus of forming the improved piezoelectric acoustic sensor.

Additional objects and advantages of the invention will be set forth in part in the description which follows and, in part, will be obvious from the description, or may be learned by practice of the invention.

The above objects of the present invention are achieved by providing an apparatus which bonds a first film to a second film to form a sensor. The apparatus comprises a base section which has a mating surface for holding the first film; a top section which has a mating surface for holding the second film, the top section and base section being mateable together to form a cavity between the top section mating surface and the base section mating surface with the first film and the second film pressed together inside the cavity to bond the first film to the second film; and internal connection port forming means for forming an internal connection port between the first film and the second film when the base section and top section are mated together with the first film and the second film pressed together inside the cavity.

The above objects of the present invention are also achieved by providing a method for forming a sensor by bonding a first film to a second film, the first film and second film each having an inner and an outer surface. The method comprises the steps of (1) maintaining the first and second films in flat positions with the inner surface of the first film adjacent to the inner surface of the second film; (2) applying an adhesive to the inner surface of at least one of the first and second films; (3) positioning an internal connection port forming device between the inner surfaces of the first and second films; (4) pressing the first and second films together to bond the inner surfaces of the first and second films together, thereby bonding the first and second films together; and (5) removing the internal port forming device from between the inner surfaces of the first and second films to form an internal connection port between the first and second films which allows an electrical connection to the inner surfaces of the bonded first and second films.

Moreover, the above objects of the present invention are achieved by providing an apparatus comprising a base section which has a mating surface for holding the first film; a top section which has a mating surface for holding the second film, the top section and base section being mateable together to form a cavity between the top section mating surface and the base section mating surface with the first film and the second film pressed together inside the cavity to bond the first film to the second film; and internal connection tab forming means for forming an internal connection tab between the first film and the second film when the base section and top section are mated together with the first film and the second film pressed together inside the cavity.

In addition, the objects of the present invention are achieved by providing a method for forming a sensor having a first film and a second film bonded together with an internal connection tab therebetween, the first film and second film each having an inner and an outer surface. The method comprises the steps of (1) maintaining the first and second films in flat positions with the inner surface of the first film adjacent to the inner surface of the second film; (2) positioning the internal connection tab between the inner surfaces of the first and second films; (3) applying a conductive adhesive to at least one of the internal connection tab, the inner surface of the first film and the inner surface of the second film, the conductive adhesive being applied to a location which will allow the inner surfaces of the first and second films and the internal connection tab to be electrically connected via the adhesive when the sensor is formed; (4) applying an insulative adhesive to the inner surface of at least one film, the insulative adhesive being applied to a location which does not cover the conductive adhesive; and (5) pressing the first and second films together to bond the inner surfaces of the first and second films together with the internal connection tab therebetween, thereby bonding the first and second films and the internal connection tab together to form the sensor.

In addition, the objects of the present invention are achieved by providing a sensor comprising an internal connection tab; first and second films, each film having an inner surface and an outer surface, the inner surface of the first film being adjacent to the inner surface of the second film; and an insulative adhesive which bonds together the first film, the second film and the internal connection tab and a conductive adhesive which provides an electrical connection between the inner surfaces of the first and second films and the internal connection tab.

BRIEF DESCRIPTION OF THE DRAWINGS

These and other objects and advantages of the invention will become apparent and more readily appreciated from the following description of the preferred embodiments, taken in conjunction with the accompanying drawings, of which:

FIGS. 2(A), 2(B) and 2(C) are diagrams illustrating a vacuum holding fixture according to a first embodiment of the present invention.

FIGS. 4(A) and 4(B) are diagrams of a top section of a vacuum holding fixture according to a third embodiment of the present invention.

FIGS. 5(A) and 5(B) are diagrams of a base section of a vacuum holding fixture according to the third embodiment of the present invention.

DETAILED DESCRIPTION OF THE PREFERRED EMBODIMENTS

Figure 1:
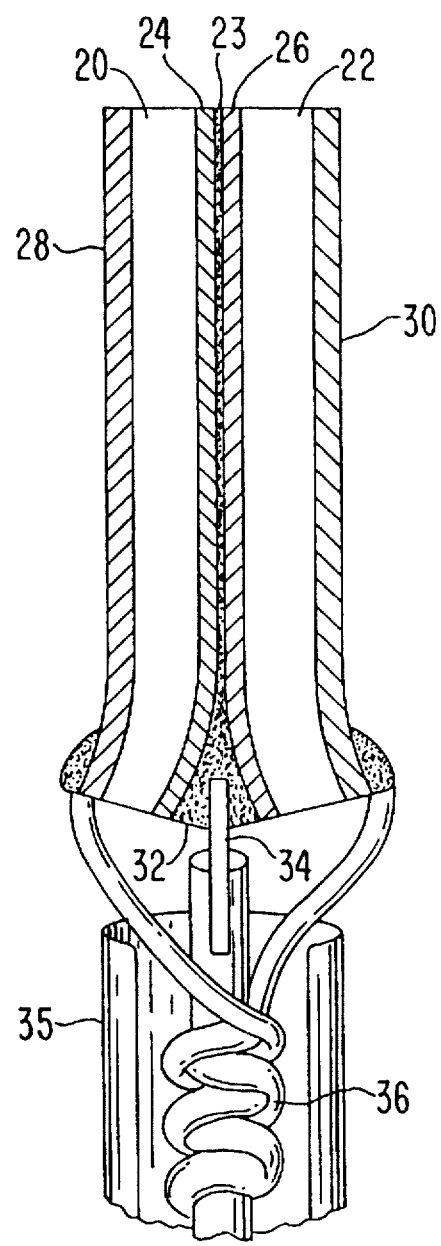
FIG. 1 (prior art) is a diagram of a prior art sensor.

Reference will now be made in detail to the present preferred embodiments of the present invention, examples of which are illustrated in the accompanying drawings, wherein like reference numerals refer to like elements throughout.

Figure 2B:
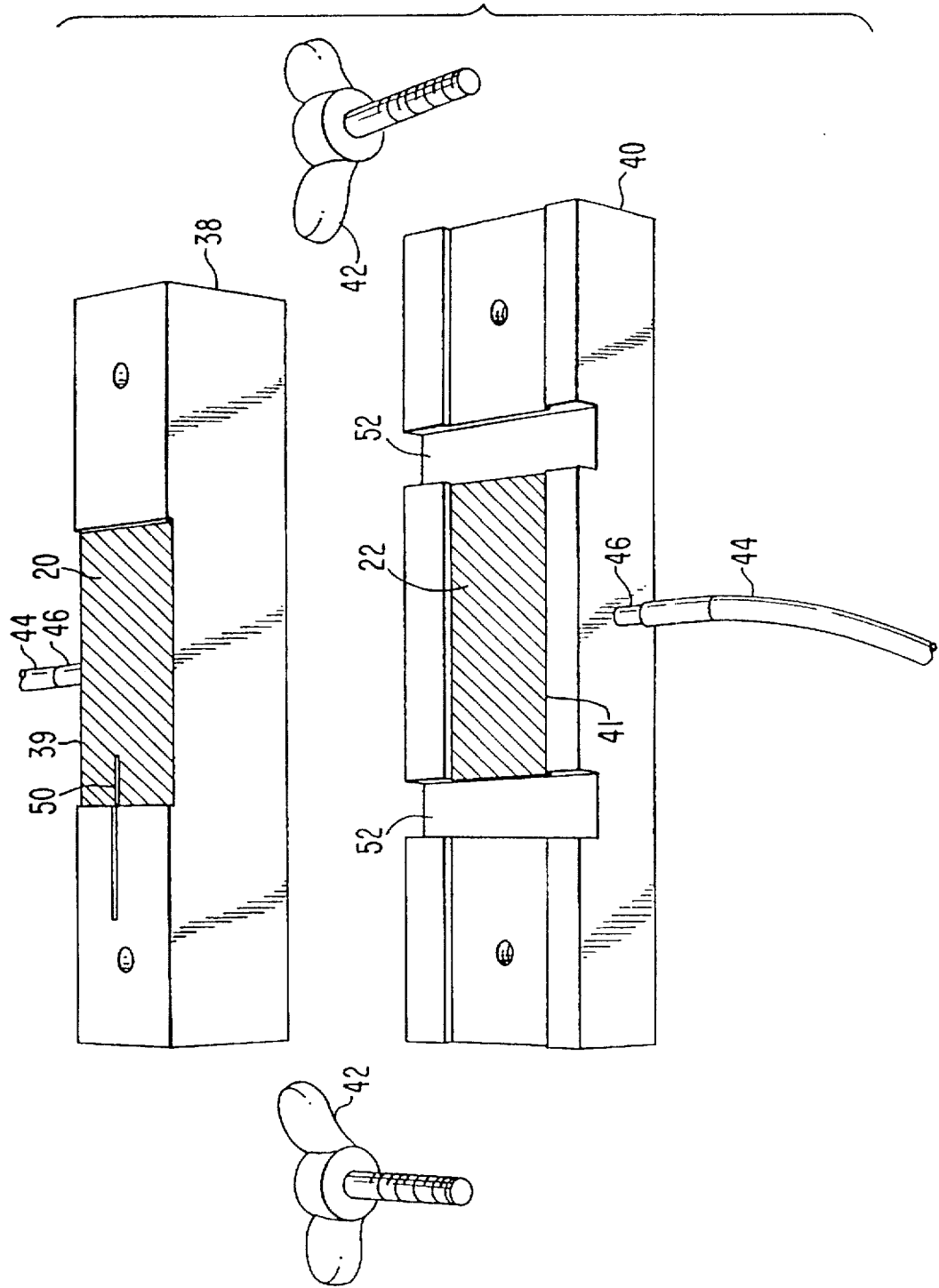

FIGS. 2(A), 2(B) and 2(C) are diagrams illustrating a vacuum holding fixture according to a first embodiment of the present invention. As illustrated in FIG. 2(A), the vacuum holding fixture comprises a top section 38 having a mating surface 39 and a base section 40 having a mating surface 41. Top section 38 and base section 40 can be mated together and held in place by wing-nut screws 42. Mating surfaces 39 and 41 are machined so that a ⅝"×1.5"×0.020" cavity is formed when top section 38 and base section 40 are mated together. Vacuum inlet ports 43 are located in the center of the cavity in top section 38 and the center of the cavity in base section 40. Clear, flexible plastic tubing, such as PVC lines, serve as vacuum discharge lines 44. Vacuum discharge lines 44 are connected to vacuum discharge tubes 46 in top section 38 and base section 40 for applying a vacuum to the vacuum holding fixture. Vacuum inlet ports 43 extend through top section 38 and base section 40 to a side of top section 38 and base section 40, respectively, and are connected to vacuum discharge lines 44. A Y-jumper (not illustrated) connects vacuum discharge lines 44 to a single line (not illustrated). The single line is connected to a vacuum gauge (not illustrated) and vacuum system (not illustrated). A vacuum gauge that measures to 30" Hg is suitable for the bonding process. A 0.012" diameter wire 50 extends ¼" into the cavity. A ¼" wide by ⅛" deep channel 52 is machined in base section 40 on each side of the cavity to provide a place for excessive adhesive to squeeze out.

As illustrated in FIG. 2(B), first film 20 is placed on mating surface 39 of top section 38. Wire 50 extends from top section 38 and first film 20 is placed underneath wire 50. Second film 22 is placed on mating surface 41 of base section 40. First film 20 and second film 22 are each, preferably, ⅝"×1¼" rectangular shaped and 0.004" thick. First film 20 and second film 22 are oriented so that the positive or negative charged dipole moments face each other (positive—positive or negative—negative). Vacuum is applied to the vacuum holding fixture to hold first film 20 and second film 22 flatly in place through the remainder of the bonding operation. Fast setting insulative epoxy adhesive is applied to the inner surface of each film and should cover the entire surface of each film.

As illustrated in FIG. 2(C), top section 38 is then mated to base section 40. Top section 38 and base section 40 are clamped together with wing-nut screws 42. Preferably, wing-nut screws 42 are used to facilitate ease of clamping. Excessive adhesive will squeeze out into channels 52. When top section 38 and base section 40 are mated together with first film 20 and second film 22 therebetween, wire 50 is sandwiched between first film 20 and second film 22. The purpose of wire 50 is to form internal connection port 32 (see FIG. 1) for use when first film 20 and second film 22 are removed from the vacuum holding fixture. Thus, one end of wire 50 is sandwiched between first film 20 and second film 22 while top section 38 and base section 40 are mated together, and the other end of wire 50 is connected to top portion 38.

After approximately ten minutes, the epoxy is cured enough to disassemble the vacuum holding fixture. Wing-nut screws 42 are removed and top section 38 should be gently tapped with a soft-faced hammer until top section 38 slides off base section 40. Top section 38 and base section 40 should be gently separated. First film 20 and second film 22 are now bonded together and should slide off wire 50. First film 20 and second film 22, bonded together, form a sensor. Any excess adhesive should be removed from the sensor edges. The fixture can be cleaned and will then be ready for bonding of another sensor. A release agent is preferably sprayed on mating surfaces 39 and 41 before top section 38 and base section 40 are mated together. The release agent acts to ease the separation of top section 38 from base section 40 and also eases removal of first film 20 and second film 22 from top section 38 and base section 40.

Internal connection port 32 (see FIG. 1) is formed by removing the sensor from the vacuum holding fixture and sliding the sensor off wire 50. As previously discussed and illustrated in FIG. 1, internal connection port 32 is a cavity which allows center conductor wire 34 of coaxial cable 35 to be connected to inner surfaces metal coatings 24, 26 of the bonded first film 20 and second film 22. Thus, a sensor having an internal connection port 32 for connection to a coaxial cable is formed by this embodiment of the present invention, wherein two pieces of piezoelectric film are bonded together with a fast-setting epoxy adhesive.

Thus, wire 50 acts as an internal connection port forming mechanism. However, such an internal connection port forming mechanism does not have to be a wire. It could be a rod or any other type of device which forms a suitable cavity when first film 20 and second film 22 are pressed together.

In summary, the vacuum holding fixture holds two pieces of film in place. Adhesive is applied to the films. The fixture is clamped together and the adhesive cures. This embodiment of the present invention maintains a uniform adhesive bond line between the two pieces of film, provides an internal connection port between the inner surface metal coatings of each film and eliminates excessive adhesive clean-up. The vacuum holding fixture according to the embodiments of the present invention also maintains uniform thickness of the adhesive between the films and maintains uniform "flatness" of the films resulting in uniform thickness of the sensor.

Figure 3A:
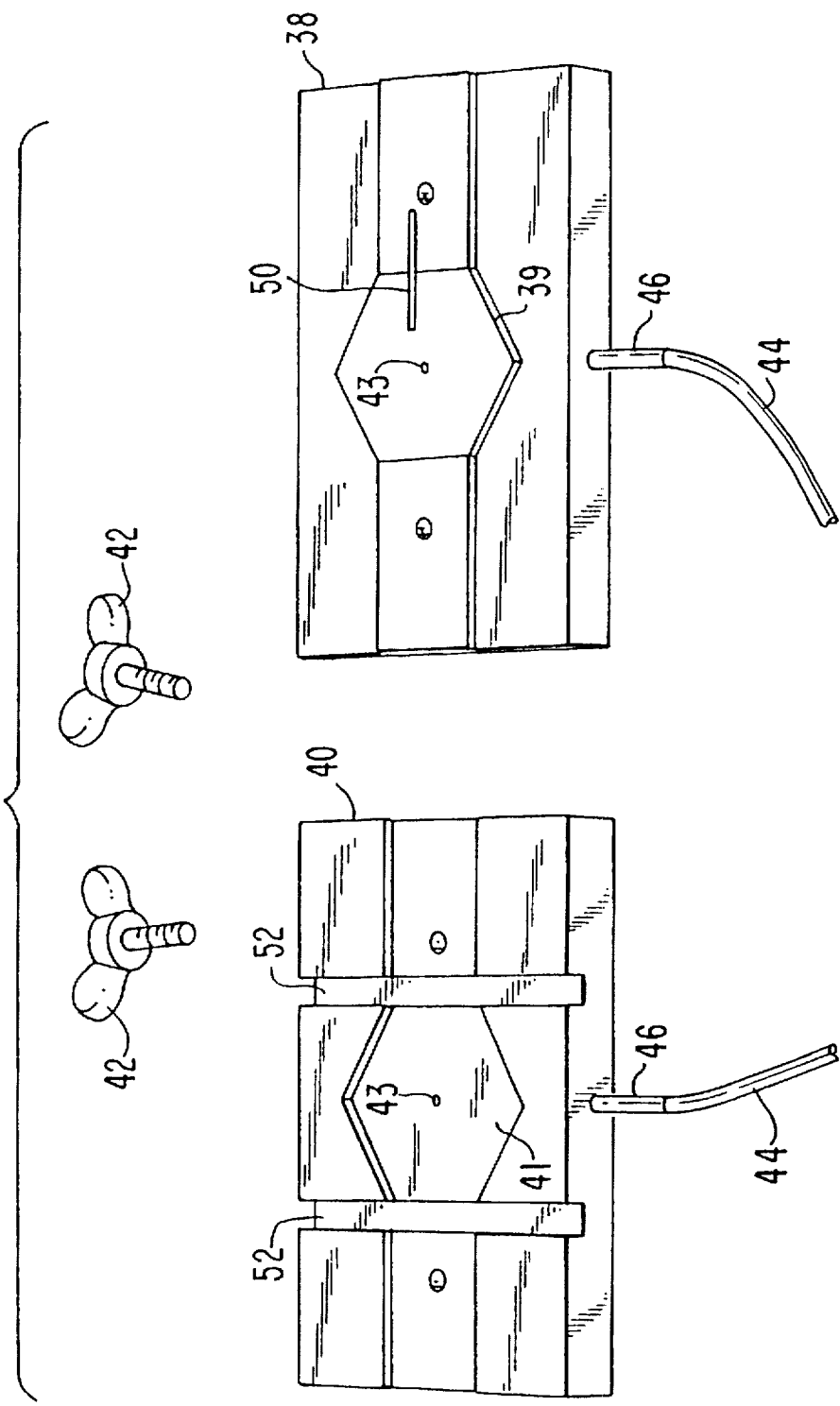
FIGS. 3(A), 3(B) and 3(C) are diagrams illustrating a vacuum holding fixture according to a second embodiment of the present invention.
Figure 3B:
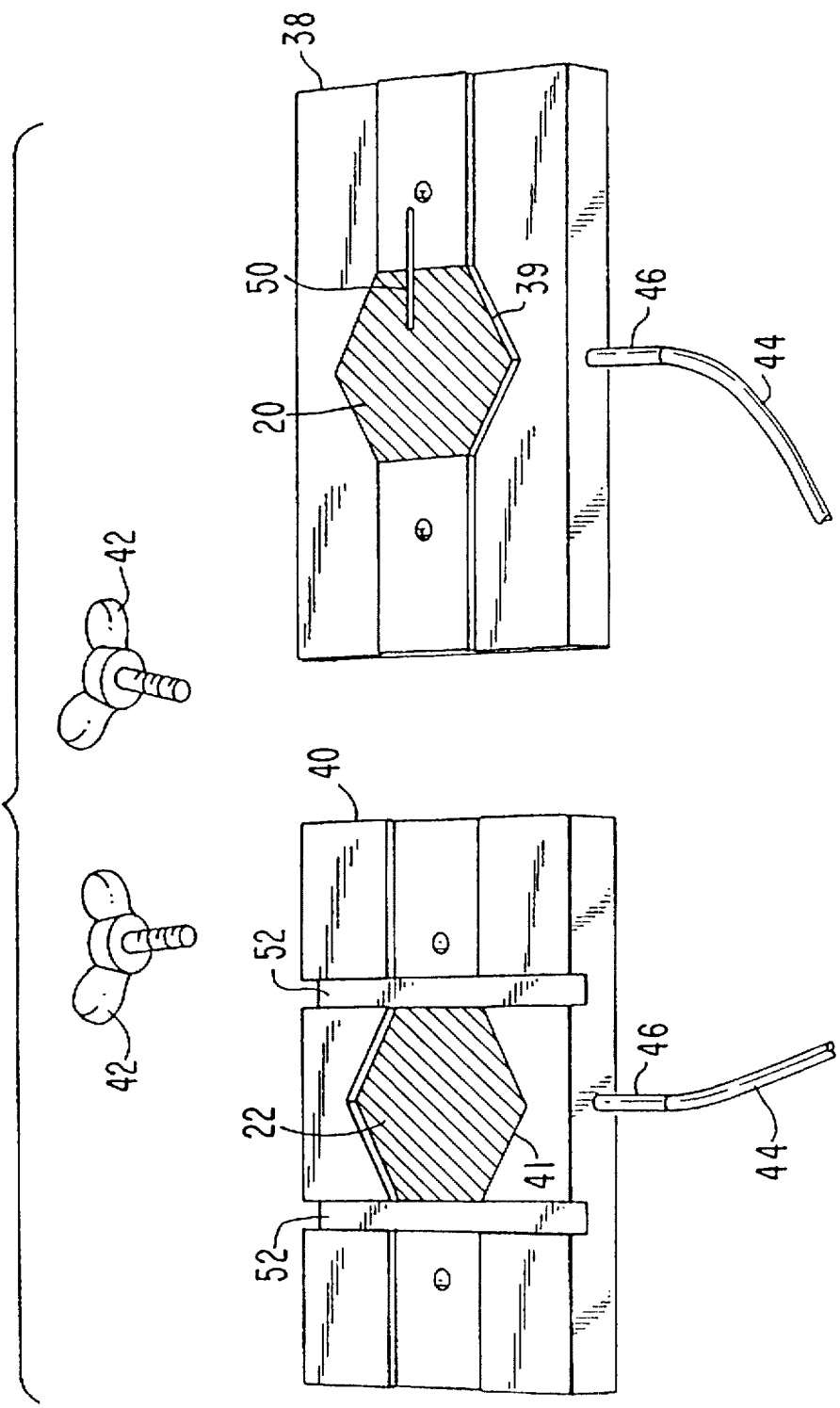
Figure 3C:
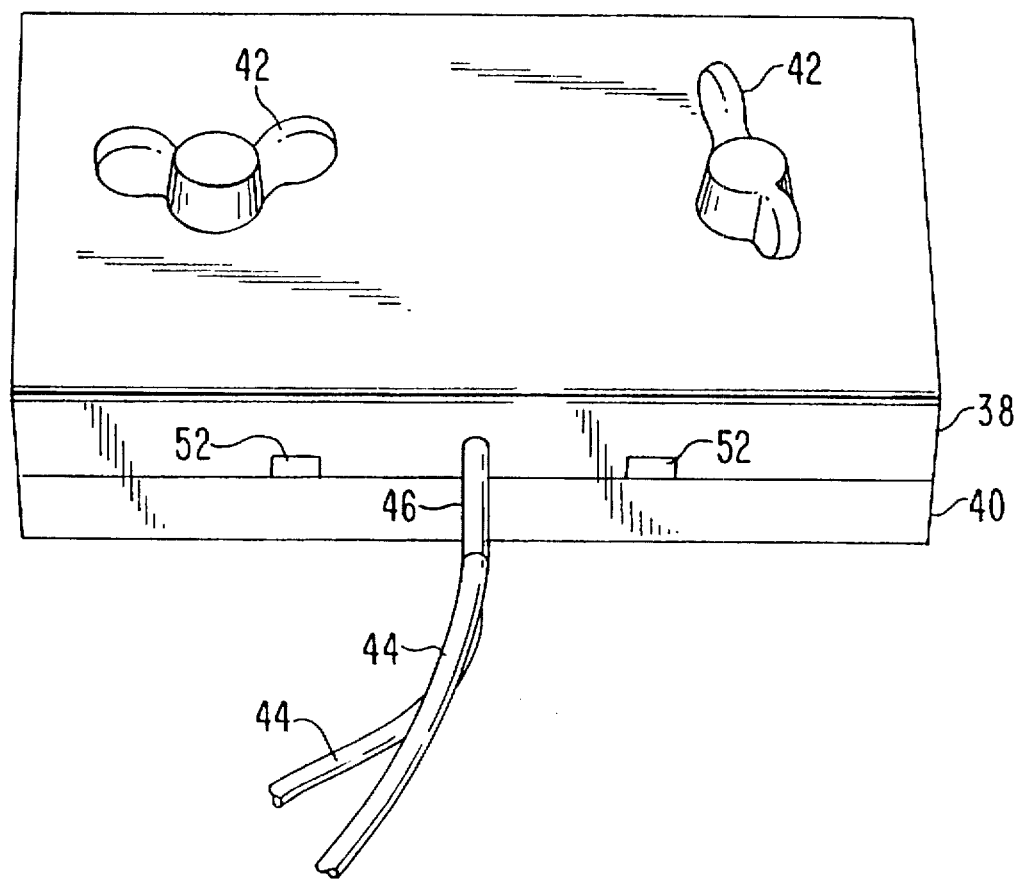

FIGS. 3(A), 3(B) and 3(C) are diagrams illustrating a vacuum holding fixture according to a second embodiment of the present invention. This embodiment is similar to the embodiment illustrated in FIGS. 2(A), 2(B) and 2(C) except that the second embodiment forms hexagonal shaped sensors from hexagonal shaped pieces of film, as opposed to the rectangular shaped sensors formed from rectangular shaped pieces of film as illustrated in FIG. 2(B). In FIGS. 3(A) and 3(B), the mating surfaces 39, 41 of top section 38 and base section 40 are hexagonal shaped to form a hexagonal shaped cavity when top section 38 and base section 40 are mated together. This can be compared to the rectangular shaped mating surfaces 39, 41 illustrated in FIGS. 2(A) and 2(B). In other respects, the embodiment illustrated in FIGS. 3(A), 3(B) and 3(C) is similar to the embodiment illustrated in FIGS. 2(A), 2(B) and 2(C). The formation of hexagon shaped sensors allows a plurality of sensors to be positioned very close to each other on the mother's body so that the sensors are all positioned within the same, small diameter circle. For example, seven hexagonal shaped sensors can be arranged in a smaller diameter circle as compared to seven rectangular shaped sensors having the same surface area as the hexagon shaped sensors. Thus, by using several sensors on the mother's body, as opposed to a single sensor, a fetal monitoring system produces more accurate results.

The sensors formed by the first and second embodiments of the vacuum holding fixture have an internal connection port 32 for connecting the respective sensor to the center conductor of a coaxial cable. However, FIGS. 4(A), 4(B), 5(A), 5(B), 6(A) and 6(B) illustrate a third embodiment of a vacuum holding fixture which forms an improved sensor. The improved sensor has an internal connection tab 56 (see FIG. 6(A)) formed between first film 20 and second film 22, instead of having internal connection port 32 formed between first film 20 and second film 22. Internal connection tab 56 acts as a conductor for connecting to the inner surfaces of first film 20 and second film 22. Thus, there is no need to perform extra steps of attaching the center conductor of a coaxial cable to the sensor through internal connection port 32. Also, a much stronger electrical connection to the inner surfaces of the films is formed by the improved sensor, as compared to the sensor illustrated in FIG. 1.

FIGS. 4(A) and 4(B) illustrate top section 38 of the vacuum holding fixture according to the third embodiment of the present invention and FIGS. 5(A) and 5(B) illustrate base section 40 of the vacuum holding fixture according to the third embodiment of the present invention. Top section 38 and base section 40 of the third embodiment of the present invention are similar to the top section and the base section of the second embodiment of the present invention, except that the third embodiment does not include a wire for forming an internal connection port. The wire is not necessary since an internal connection port is not formed in the third embodiment of the present invention and, instead, an internal connection tab 56 is bonded between first film 20 and second film 22. Also, channels 52 are illustrated as formed in top section 38. However, channels 52 can be formed in either top section 38 or base section 40. Preferably, internal connection tab 56 is 0.003"×0.0625"×1" and is made of a copper coated "KAPTON" brand film. "KAPTON" brand film is well-known and widely available. Copper coated "KAPTON" brand film is preferred since the film does not melt when heat is applied for soldering connections. Also, a copper coating is the preferred coating. However, other brands of film can be used and other types of solderable coatings can be used. It is significantly easier make the electrical connections to internal connection tab 56 than to connect the center conductor of the coaxial cable to the inner surfaces of first film 20 and second film 22 through the internal connection port 32 of the sensor illustrated in FIG. 1.

Figure 6A:
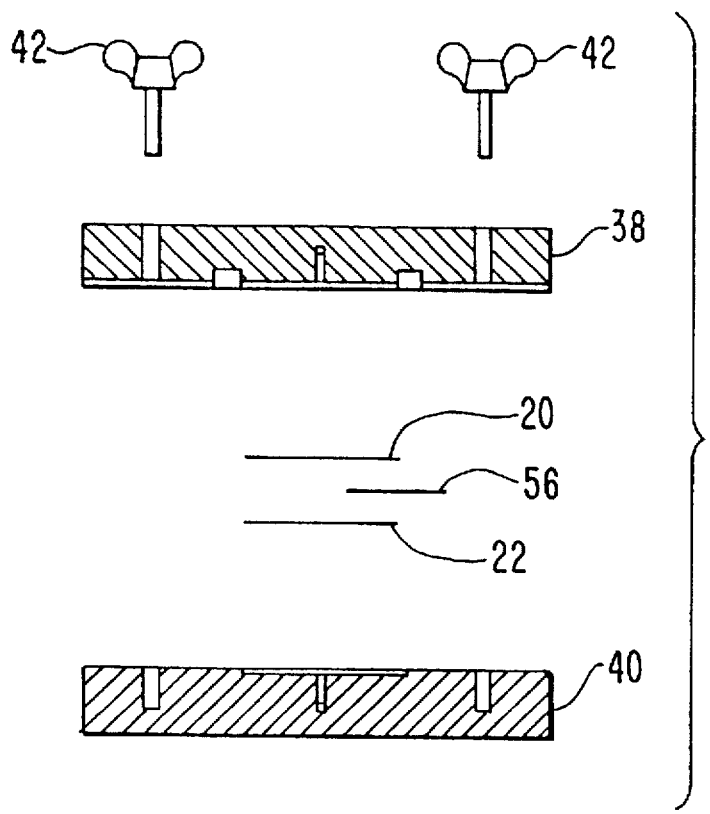
FIGS. 6(A) and 6(B) are diagrams of a vacuum holding fixture according to the third embodiment of the present invention.
Figure 6B:
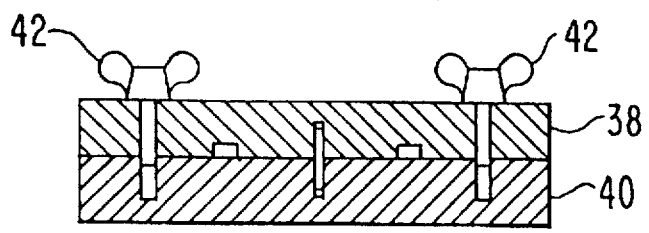

According to the third embodiment of the present invention, first film 20 is hexagonal shaped film and is placed on top section 38. Second film 22 is also hexagonal shaped and is placed on base section 40. Vacuum is applied to top section 38 and base section 40 as in the previously described embodiments to hold first film 20 tightly and flatly against top section 38 and to hold second film 22 tightly and flatly against base section 40. Internal connection tab 56 is then placed on base section 40 so that internal connection tab 56 extends, preferably, about half the length of second film 22. A small amount of conductive epoxy is then placed in the inner surface of second film 22 so that the epoxy contacts internal connection tab 56 and second film 22 and so that the epoxy will also contact first film 20 when first film 20 and second film 22 are bonded together. A preferable conductive epoxy is Chomerics 548 Part B and Hardener 29, which is widely known and available. Before first film 20 and second film 22 are bonded together, an insulative epoxy is applied to the inner surface of second film 22 so that no gaps will be present between first film 20 and second film 22 when first film 20 and second film 22 are bonded together. The insulative epoxy should not cover the conductive epoxy or else first film 20, second film 22 and internal conduction tab 56 will not be electrically connected together when the sensor is formed. After the conductive epoxy and the insulative epoxy are applied, top section 38 and base section 40 are mated together as illustrated in FIGS. 6(A) and 6(B) and wing-nut screws 42 are inserted into top section 38 and base section 40. Wing-nut screws 42 should be "finger tight" to facilitate ease of clamping. Excess insulative epoxy will flow into channels 52. After approximately ten minutes, the conductive epoxy and insulative epoxy should be cured enough to open the fixture. The vacuum should then be released and top section 38 and base section 40 should be separated. First film 20 and second film 22, bonded together with internal connection tab 56 therebetween, form one sensor.

In summary, according to the third embodiment of the present invention, first film 20 and second film 22 are bonded together with internal connection tab 56 formed therebetween. A small amount of conductive epoxy is used to maintain electrical contact between the metal coatings on the inner surfaces of first film 20, second film 22 and internal connection tab 56. Insulative epoxy exists between first film 20 and second film 22 to bond and fill in the gaps between first film 20 and second film 22 so that an electrical contact region formed by the conductive epoxy is surrounded and protected by the insulative epoxy and, preferably, no gaps exist between first film 20 and second film 22 which are not filled with insulative epoxy. There should not be an electrical connection between the inner and outer surfaces of either first film 20 or second film 22. The use of the insulative epoxy serves to prevent such a connection. Preferably, the metal coating 24, 26, 28, 30 on the inner surfaces and outer surfaces of first film 20 and second film 22 is made of nickel and covers the entire portion of each side of first film 20 and second film 22.

FIGS. 4(A), 4(B), 5(A) and 5(B) show specific measurements for top section 38 and base section 40; however, the embodiments of the present invention are not intended to be limited to these measurements and a person skilled in the art would recognize that various different measurements and sizes could be used. Also, the sensors are described as being either rectangular shaped or hexagonal shaped; however, the embodiments of the present invention are not intended to be limited to these particular shapes and a person skilled in the art would recognize that various shapes and sizes of sensors, and the corresponding shapes and sizes of the vacuum holding fixture, could be used.

Also, the sensors are not intended to be limiting only for use in an apparatus which monitors the status of a fetus. There are many other uses for such sensors. For example, the sensors could be used to detect the heartbeat of the mother or other signals or pulses originating in a human or animal body. The sensors may also be useful for sensing signals, pulses and noise in virtually any other type of body or material. Sensors described herein can also be called "bimorph" sensors.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A method for forming a sensor having a first film and a second film bonded together with an internal connection tab therebetween, the first film and second film each having an inner and an outer surface, the method comprising:

maintaining the first and second films in substantially flat positions with the inner surface of the first film adjacent to the inner surface of the second film;

positioning the internal connection tab between the inner surfaces of the first and second films;

applying a conductive adhesive to at least one of the internal connection tab, the inner surface of the first film and the inner surface of the second film, the conductive adhesive being applied to a location which will allow the inner surfaces of the first and second films and the internal connection tab to be electrically connected via the adhesive when the sensor is formed; and pressing the first and second films together to bond the inner surfaces of the first and second films together with the internal connection tab therebetween, thereby bonding the first and second films and the internal connection tab together to form the sensor.

2. A method as in claim 1, further comprising:

applying an insulative adhesive to at least one of the internal connection tab, the inner surface of the first film and the inner surface of the second film, the insulative adhesive being applied to a location which will act as an insulator to fill in gaps existing between the inner surfaces of the first and second films, yet allow the inner surfaces of the first and second films and the internal connection tab to be electrically connected via the conductive adhesive when the sensor is formed.

3. A method as in claim 1, wherein the step of maintaining the first and second films in flat positions further comprises using vacuum to maintain the first and second films in flat positions.

4. A method as in claim 2, wherein the step of maintaining the first and second films in flat positions further comprises using vacuum to maintain the first and second films in flat positions.

* * * * *